US011848537B2

(12) United States Patent
Poddar et al.

(10) Patent No.: US 11,848,537 B2
(45) Date of Patent: Dec. 19, 2023

(54) OPTOELECTRONIC OSCILLATOR USING MONOLITHICALLY INTEGRATED MULTI-QUANTUM WELL LASER AND PHASE MODULATOR (71) Applicant: Synergy Microwave Corporation, Paterson, NJ (US)

(72) Inventors: Ajay Kumar Poddar, Elmwood Park, NJ (US); Ulrich L Rohde, Upper Saddle River, NJ (US); Afshin S. Daryoush, Bryn Mawr, PA (US)

(73) Assignee: Synergy Microwave Corporation, Paterson, NJ (US)

( * ) Notice: Subject to any disclaimer, the term of this patent is extended or adjusted under 35 U.S.C. 154(b) by 383 days.

(21) Appl. No.: 17/261,950

(22) PCT Filed: Jul. 24, 2019

(86) PCT No.: PCT/US2019/043194
§ 371 (c)(1),
(2) Date: Jan. 21, 2021

(87) PCT Pub. No.: WO2020/023611
PCT Pub. Date: Jan. 30, 2020

(65) Prior Publication Data
US 2021/0167578 A1 Jun. 3, 2021

Related U.S. Application Data (60) Provisional application No. 62/702,970, filed on Jul. 25, 2018.

(51) Int. Cl.
*H01S 5/068* (2006.01)
*H01S 5/065* (2006.01)
*H01S 5/343* (2006.01)

(52) U.S. Cl.
CPC ........ *H01S 5/06821* (2013.01); *H01S 5/0656* (2013.01); *H01S 5/0657* (2013.01); *H01S 5/343* (2013.01)

(58) Field of Classification Search
CPC .......................... H01S 5/06821; H01S 5/0656
See application file for complete search history.

(56) References Cited

U.S. PATENT DOCUMENTS 6,438,148 B1 * 8/2002 Hui ........................ H01S 5/1228
398/154
6,600,382 B1 7/2003 Klymyshyn
(Continued)

FOREIGN PATENT DOCUMENTS

| JP | S6410683 A | 1/1989 |
|---|---|---|
| WO | 2014105707 A1 | 7/2014 |
| WO | 2014172003 A1 | 10/2014 |

OTHER PUBLICATIONS

International Search Report including Written Opinion for Application No. PCT/US2019/43194, dated Oct. 15, 2019, pp. 1-16.
(Continued)

*Primary Examiner* — Tuan N Nguyen
(74) *Attorney, Agent, or Firm* — Lerner David LLP (57) ABSTRACT

A tunable multi-mode laser is configured to generate a multi-mode optical signal at a tuned wavelength. The laser includes a semiconductor optical gain region, a feedback region, and a phase modulation region between the gain and feedback regions. Each of the regions may be monolithically integrated. A feedback loop is coupled to the tunable laser to receive the optical signal and includes at least one delay line. The delay line may also be monolithically integrated. An output of the delay line is fed back to the tunable multi-mode laser in order to provide at least one of self-injection locking and self-phase locked looping for the multi-mode tunable laser. Each of the optical gain region and phase modulation (Continued)

region of the laser is biased by the output of the delay line in order to reduce phase drift of the optical signal.

27 Claims, 7 Drawing Sheets

(56) References Cited

U.S. PATENT DOCUMENTS

| | | | |
|---|---|---|---|
| 6,661,377 B2 | 12/2003 | Lee et al. | |
| 7,006,542 B2 | 2/2006 | Muenter | |
| 7,088,189 B2 | 8/2006 | Rohde et al. | |
| 7,447,246 B2 * | 11/2008 | He | H01S 5/12 372/20 |
| 7,545,843 B2 * | 6/2009 | Armani | G02B 6/12007 372/19 |
| 2002/0018611 A1 | 2/2002 | Maleki et al. | |
| 2004/0057058 A1 | 3/2004 | Takayasu et al. | |
| 2004/0264977 A1 * | 12/2004 | Yap | G02F 2/02 398/161 |
| 2006/0239606 A1 | 10/2006 | Strecker | |
| 2014/0177659 A1 | 6/2014 | Goobar et al. | |
| 2014/0270786 A1 * | 9/2014 | Poddar | H03B 17/00 398/116 |

OTHER PUBLICATIONS

Simler Y et al: "Pulsation stabilization and enhancement in self-pulsating laser diodes", IEEE Photonics Technology Letters, IEEE, USA, vol. 4, No. 4, Apr. 1, 1992 (Apr. 1, 1992), pp. 329-332, XP011410296, ISSN: 1041-1135, DOI: 10.1109/68.127203 * p. 330, left-hand column—p. 331, left-hand column; figure 2 *.
Ironside C N et al: "Review of optoelectronic oscillators based on modelocked lasers and resonant tunneling diode optoelectronics", International Conference on Applications of Optics and Photonics, SPIE, 1000 20th St. Bellingham WA 98225-6705 USA, vol. 8001, No. 1, May 21, 2011 (May 21, 2011), pp. 1-8, XP060015891, DOI: 10.1117/12.894635 [retrieved on Jan. 1, 1901] * figure 1 *.
Sun Tianchi et al: "Integrated implementation of ultra stable VCO using optical Self-ILPLL techniques", 2016 IEEE MTT-S International Microwave Symposium (IMS), IEEE, May 22, 2016 (May 22, 2016), pp. 1-4, XP032941016, DOI: 10.1109/MWSYM.2016. 7539992 [retrieved on Aug. 10, 2016] * the whole document *.
Extended European Search Report issued in Appln. No. 19842196.8 dated Mar. 29, 2022 (10 pages).
Rohde, U.L. et al., "Low Noise Low Cost Ultra Wideband N-Push VCO" Jun. 2005, pp. 1171-1174, IEEE.
Tobing, L. et al., "Fundamental Principles of Operation and Notes on Fabrication of Photonic Microresonators" Photonic Microresonator Research and Applications, Jan. 2010, pp. 1-27, vol. 156.
Armani, D.K, et al., "Ultra-high-Q toroid microcavity on a chip" Department of Applied Physics, Nature Publishing Group, Feb. 2003, pp. 925-928, vol. 421.
Pan, Biwei, Lu, Dan, Zhang, Limeng, Zhao, Lingjuan,"A Widely Tunable Optoelectronic Oscillator Based on Directly Modulated Dual-Mode Laser", IEEE Photonics Journal, December DOI: 10.1109/ JPHOT.2015.2498906.
Yu, Liqiang,Lu, Dan, Pan, Biwei, Zhao, Lingjuan, Wu, Jiagui, Xia, Guangqiong, Wu, Zhengmao, Wang, Wei?"Monolithically Integrated Amplified Feedback Lasers for High-Quality Microwave and Broadband Chaos Generation"?Journal of Lightwave Technology? Apr. 2014?vol. 32,No. 20?p. 3595-3601?DOI: 10.1109/JLT.2014. 2320371 (Reference showing well-known technology).
Sun, Y., Chen, Y. B., Wang, Y., Pan, J. Q., Zhao, L. J. Chen, W. X.,Wang, W .?"Widely Frequency-Tunable Optical Microwave Source Based on Amplified Feedback Laser"? Dec. 2008 IEEE PhotonicsGlobal@Singapore?2008? p.1-4?DOI <mailto:PhotonicsGlobal@Singapore?2008?p. 1-4?DOI>: 10.1109/ IPGC.2008.4781441.

\* cited by examiner

OPTOELECTRONIC OSCILLATOR USING MONOLITHICALLY INTEGRATED MULTI-QUANTUM WELL LASER AND PHASE MODULATOR

CROSS-REFERENCE TO RELATED APPLICATIONS

The present application is a national phase entry under 35 U.S.C. § 371 of International Application No. PCT/US2019/043194, filed Jul. 24, 2019, published in English, which claims priority from U.S. Provisional Patent Application No. 62/702,970 filed Jul. 25, 2018, all of which are incorporated herein by reference.

BACKGROUND OF THE INVENTION

Optoelectronic oscillators (OEO) receive pump continuous energy from an optical source, such as a laser, in addition to energy in the form of direct current (DC) power from a power supply. The energy is converted into radio frequency (RF) and microwave signals based on efficient power conversion by meeting the required gain and phase characteristics at an oscillation frequency using a narrowband filtering mechanism. Such OEOs typically experience a low loss optical delay, low temperature sensitivity, and can be realized in modular structures. These benefits often lead to a high quality factor and greater stability in both the short term and the long term, as compared to purely electronic oscillators.

An optoelectronic oscillator generally utilizes an optical modulator (e.g., an electro-optic Mach-Zhender optical intensity modulator) to convert continuous wave light energy from the laser into a modulated stable optical signal at a spectrally pure electrical signal (e.g., an RF microwave signal). The modulated signal is transmitted through a length of fiber optic cable, and then fed to an RF source, which is in turn used to control the optical modulator.

One factor for sustaining a pure sinusoidal oscillating signal in any oscillator is active filtering of the sustained signal from the surrounding interfering sources that contribute to close-in to carrier phase noise. Phase noise reduction may be accomplished in several ways, some of which are described in commonly-owned U.S. Pat. No. 9,088,369 (the '369 patent), the disclosure of which is hereby incorporated by reference in its entirety. In the '369 patent, multiple lengths of fiber optic cables combined with custom optical receivers are used to provide multiple electrical references for self-injection locking (self IL), self-phase locked looping (self PLL), and/or self-mode locking (self ML) functions in a closed loop part of the low noise stable RF oscillator. The configurations described in the '369 patent support self-sustained oscillations, provided that the electrical feedback signal fed to the modulator meets certain oscillation conditions in terms of its amplitude and phase, while corrections to any phase errors are provided using corrective electrical feedback systems to the tunable RF oscillator in self-IL and self-PLL arrangements, as well as combination self-ILPLL arrangements. Corrective feedback to the optical laser source may also be provided in the case of a self-ML arrangement using an electrical error signal.

Self-injection locking may be used to reduce far-away from carrier phase noise in an OEO by forcing oscillations. In a conventional IL oscillator arrangement, a stable master oscillator (i.e., the optoelectronic oscillator) pulls a less stable slave oscillator (i.e., voltage controlled RF oscillator) to a harmonic frequency of the master oscillator (including fundamental frequency), within a range of detuning frequencies known as the frequency locking range. Pulling the frequency of the slave oscillator to that of the master oscillator reduces the slave oscillator's frequency variations within the frequency locking range, thereby also reducing phase noise of the slave oscillator within the frequency locking range. The optical delay line characteristics—in terms of efficient modulation and low electronic noise—makes the self-IL process more efficient than a conventional IL arrangement, and makes the reduction of close-in to carrier phase noise more significant.

Self-phase locked looping may be used to reduce phase noise in an OEO using a single or even multiple phase locked loop (PLL) with different fiber delay elements. In a conventional PLL oscillator arrangement, the phase of a reference signal with various time delays (i.e., master signal from OEO with various fiber delay lengths) is compared to the instantaneous phase of the RF oscillator's signal using phase comparators. The difference between the phase of each the reference signals and the RF oscillator is used to generate phase error outputs, which are used as variable signals to correct for close-in to carrier phase deviations in the phase and/or frequency of the slave oscillator. The efficient and low noise amplification of the closed loop system of the PLL arrangement provides coherent locking to and tracking of the delayed reference signal. Thus, the PLL mechanism will lead to further improvement in close-in to carrier phase noise.

A monolithically integrated self-injection locked self-phase-locked looped (self IL-PLL) OEO is disclosed in commonly owned U.S. Pat. No. 9,094,133 ('133 patent), the disclosure of which is hereby incorporated by reference herein in its entirety. The '133 patent discloses a design topology for establishing an integrated IL-PLL OEO at a relatively small size, compared to other modularly designed IL-PLL OEOs, such as the OEO described in commonly owned. The integration techniques of the '133 patent are compatible with low cost silicon manufacturing techniques thanks to advances in hybrid silicon laser fabrication.

RF oscillators currently known in the art may achieve a phase noise reduction of, at best, about −110 to about −120 dBC/Hz at 10 kHz offset. While the advances in phase noise reduction using self-IL and self-PLL are effective at increasing the frequency stability for the RF oscillators, using self-IL and self-PLL arrangements in combination has the effect of a larger tracking range and shorter pull-in time. Self-ILPLL arrangements provide a stable enough signal to satisfy some oscillator technologies in current and future applications. But cellular systems (e.g., broadband MIMO, UWB, 5G LTE, IEEE 802.11AD, etc.) rely on fitting an ever increasing amount of data into a limited bandwidth that gets even more crowded over time. Operations require smaller and smaller wavelengths (higher frequencies), and are beginning to approach even millimeter-wave frequencies.

In order to fit data into a limited bandwidth, the frequency at which the data is transmitted must be kept to a stable fixed bandwidth as much as possible. Additionally, the importance of frequency stability is even greater when the quality factor of a resonator included in the oscillator is reduced (e.g., to $Q<10^{15}$), for instance due to limitations at millimeter-wave frequencies. In some applications, such as accurate space docking, collision warnings, and deep space communications, even small unwanted shifts in the frequency and phase of oscillators can be problematic and must be kept to a minimum. Known techniques and arrangements for phase noise reduction using the currently known self-ILPLL OEO technology may not achieve a sufficiently stable signal, and thus may not yield a commercially viable product. Significant innovations in design efficiency and noise reduction would be needed to accommodate a small size and low cost microelectronic manufacturing processes to meet the continuously increasing demand for quality services at a lower size and cost of integration.

As a result, there is a need for an optoelectronic oscillator having design topologies that meet the requirements for stable ultra-low phase noise frequency synthesizers in a small size and at a low cost.

BRIEF SUMMARY OF THE INVENTION

The present disclosure provides a monolithically integrated OEO for optically forcing the oscillation frequency to sustain a stable RF signal. Like prior designs, the OEO includes at least one or both of a self-IL component and a self-PLL component.

One aspect of the monolithically integrated OEO is the introduction of a gain medium using a monolithically integrated multi quantum well (MQW) structure. The MQW structure may include each of a semiconductor optical amplifier (SOA) gain section and a feedback generator section acting as an optical filter in order to yield a multi-mode laser having inter-modal oscillation. The inter-modal separation frequencies of the laser output result in generation of microwave or millimeter-wave RF frequencies. The self-IL and self-PLL components of the OEO may then be used to stabilize the generated RF frequencies through forced oscillation techniques. The concept of reducing phase noise for a large number of multi-mode oscillations has been demonstrated in other settings, such as by providing a tunable N-push oscillator configuration and dynamically compensating for phase errors between each oscillator, but has not been applied an optoelectronic environment, such as to stabilize the inter-modal oscillation frequencies generated by an MQW laser structure.

Another aspect of the monolithically integrated OEO is the introduction of an optical phase modulator topography monolithically integrated with the MQW laser gain and feedback sections. While the general concept of using index of refraction variation in an optical waveguide to achieve phase modulation has been known for some time, the integration of the phase modulator with the gain and feedback sections enables for improved frequency tuning in the closed loop OEO system. In particular, the RF oscillation frequency generated as a result of the inter-modal oscillations may be tuned by adjusting the index of refraction of the optical waveguide.

Yet another aspect of the monolithically integrated OEO is the introduction of delay components using monolithically compatible techniques. In order to generate the delay necessary to reduce phase noise in a self-IL or self-PLL OEO, generally a fiber optic cable of significant length (e.g., 3.5 km) is provided. In the present application, the delay component in the optical portion of the OEO loop may be achieved using a resonator having a high energy storage delay. In some resonators, the amount of delay may be adjustable by adjusting the quality factor of the resonator.

Another aspect of the present disclosure further provides for a device including a tunable multi-mode laser configured to generate a multi-mode optical signal at a tuned wavelength, and a feedback loop coupled to the tunable laser to receive the optical signal and including at least one delay line. An output of the delay line may be fed back to the tunable multi-mode laser in order to provide at least one of self-injection locking and self-phase locked looping for the multi-mode tunable laser. The multi-mode tunable laser may further include a semiconductor optical gain region at its first end, a feedback region at its second end, the feedback region including a feedback mirror configured to sustain an optical signal at a plurality of wavelengths separated by an inter modal separation frequency, and a phase modulation region between the semiconductor optical gain region and feedback region, the phase modulation region being configured to control a phase of the optical signal transmitted through the phase modulation region. The output of the delay line fed back into the laser may be configured to bias each of the optical gain region and phase modulation region in order to reduce phase drift of the optical signal.

In some examples, the multi-mode tunable laser may be formed from a PIN structure having a p-type semiconductor region, an n type semiconductor region, and an active layer between the p type and n type semiconductor regions. The semiconductor optical gain region may include a multi quantum well structure formed along the active layer. The PIN structure may be formed from indium phosphide. The multi quantum well structure may be formed from one of an indium gallium arsenide phosphide alloy or an indium aluminum arsenide alloy.

In some examples, the inter-modal separation frequency may be about 40 GHz.

In some examples, the feedback mirror of the feedback region may be one of a distributed Bragg reflector or a Fabry-Perot resonator.

In some examples, the phase modulation region may include a phase modulator having a sensitivity of about 15 degrees/(V*mm) under an applied voltage of between 6 to 7 volts.

In some examples, the feedback loop may be one of a self-injection locking component, a self-phase locked looping component, or a combined self-injection locking self-phase locked looping component, including the delay line.

The self-injection locking component may include a semiconductor optical amplifier configured to amplify an output of the delay line, and an optical combiner configured to receive each of the optical signal generated by the laser and the output of the delay line, and to feed the output of the delay line output back into the laser. In some examples, the laser may include a first current source for controlling gain at the optical gain region, and a second current source for controlling phase modulation at the phase modulation region. Each of the first current source and second current source may be electrically isolated from each other. The optical combiner may be configured to feed the output of the delay line into each of the first current source and the second current source.

In some examples, the semiconductor optical amplifier may have a gain of about 2 dB, and the feedback loop may be configured to reduce a frequency drift of the optical signal over a duration of 1 hour from more than 11 GHz to less than 8 GHz. In other examples, the semiconductor optical amplifier may have gain of about 5 dB, and the feedback loop may be configured to reduce a frequency drift of the optical signal over a duration of 1 hour from more than 11 GHz to less than 6 GHz.

The self-phase locked looping component may include a first optical-to-electrical converter configured to receive an undelayed version of the optical signal from the laser and to convert the received signal from an optical domain to an electrical domain, a first electrical line configured to receive the converted undelayed signal from the first optical-to-electrical converter, a second optical-to-electrical converter configured to receive a delayed version of the optical signal from the delay line and to convert the received signal from the optical domain to the electrical domain, a second electrical line configured to receive the converted delayed signal from the second optical-to-electrical converter, and a phase mixer coupled to each of the first and second electrical lines and configured to combine the undelayed and delayed converted signals in to a combined signal. The device may be further configured such that the combined signal may be fed back into the laser.

In some examples, the device may further include an amplifier coupled to an output of the mixer and configured to amplify the combined signal. The device may be configured such that the amplified combined signal is fed back into the laser. Each of the first and second electrical lines may include a narrowband filter for filtering the undelayed and delayed converted signals, respectively. Each narrow band filter may be centered at a same frequency selected based on the inter-modal separation frequency.

In some examples, the device may further include an optical coupler coupled to an output of the laser. The optical coupler may be configured to split the optical signal generated by the laser, whereby only a portion of the optical signal generated by the laser is provided to the delay line.

In some examples, any combination or all of the laser components may be monolithically integrated. Additionally, the laser components and any one or combination of feedback loop components may be monolithically integrated. For instance, the laser and the delay line may be monolithically integrated. The delay line may include a delay element, such as a toroidal micro-resonator or a ring micro-resonator. The toroidal micro-resonator may have a radius of about 60 microns. The ring shaped micro-resonator may have a diameter of about 10 microns. In some instances, the delay element may have a quality factor in the order of $10^{11}$ for a laser operating at a wavelength of about 1550 nm. In some instances, the delay element may create a delay of about 250 is. Finally, in some instances, the delay line may include one or more photonic bandgap fibers.

In some examples, the feedback loop may include a plurality of delay lines. Each delay line may provide at least one of injection locking feedback or phase locked looping feedback to the multi-mode tunable laser. In such an example of phase locked looping feedback, at least one phase locked looping feedback element may have an external reference signal to lock oscillations of the optical signal.

In some examples, each of the gain, feedback and phase modulation regions of the tunable multi-mode laser may be monolithically integrated.

A further aspect of the present disclosure provides for an optoelectronic device having each of a tunable laser and an optoelectronic feedback loop. The tunable laser may be configured to generate an optical signal at a tuned wavelength with a plurality of modes having an inter-modal separation frequency with a range of RF frequencies. The feedback loop may be coupled to the tunable laser to receive the optical signal, and include at least one delay component over which the optical signal may be stored. An output of the optoelectronic feedback loop may be connected to the tunable laser for feeding the optical signal back into the laser.

In some examples, the tunable laser may further include a PIN structure having an active layer between p type and n type semiconductor regions, a feedback mirror including one of a distributed Bragg reflector or a Fabry-Perot resonator, the feedback mirror being configured to lase at a selected optical wavelength, a phase modulator for controlling a phase of the optical signal, and a multi quantum well structure formed along the active layer of the PIN structure. The feedback loop may provide for self-injection locking and self-phase locked looping of the optical signal to stabilize the inter-modal separation frequency of the optical signal. For instance, the feedback loop may be configured to control the phase modulator to have a phase condition that meets Barkhausen oscillation conditions in order to stabilize the inter-modal separation frequency of the optical signal.

DETAILED DESCRIPTION

Figure 1:
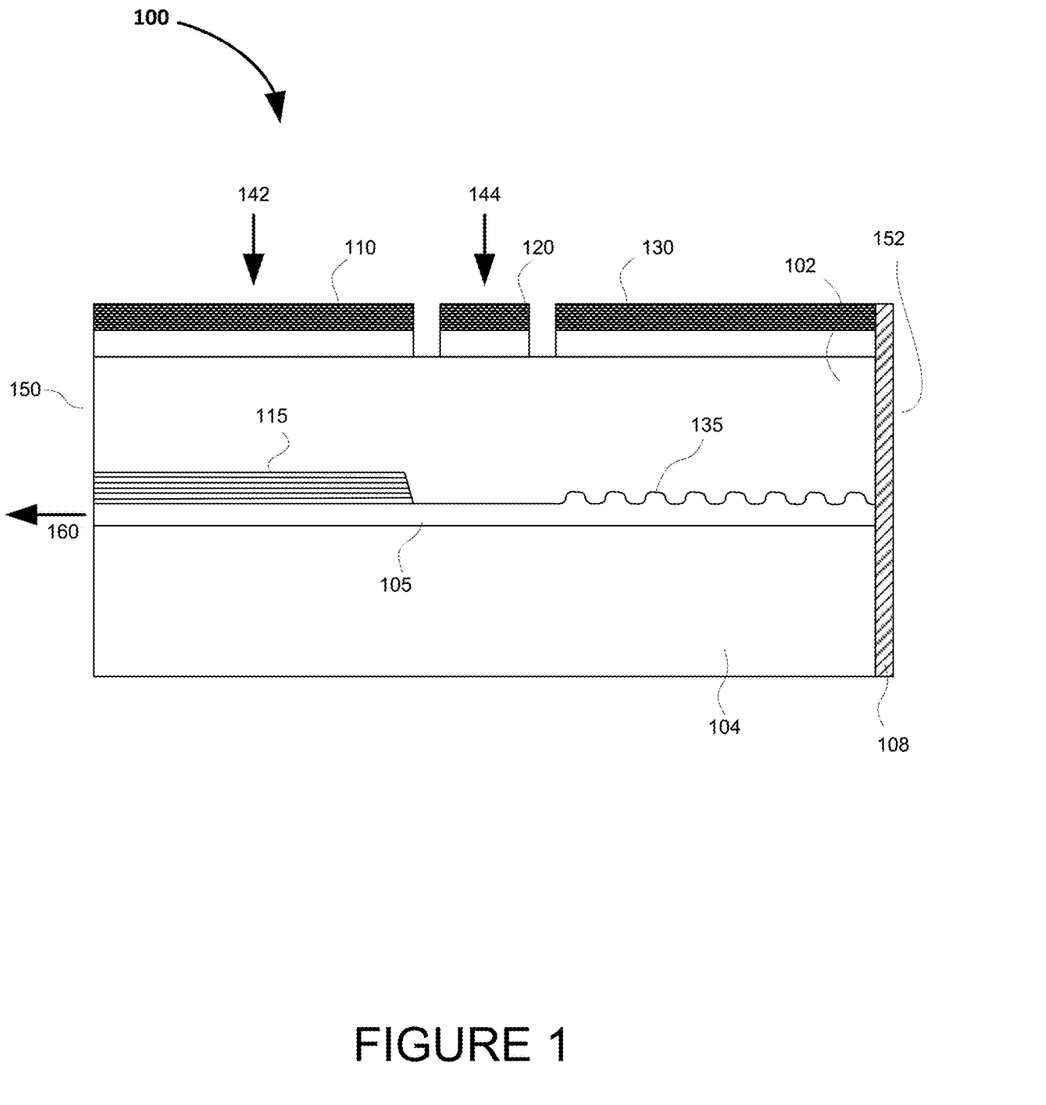
FIG. 1 is a cross-sectional side view of a tunable multi-mode laser in accordance with an aspect of the present disclosure.

The optical portion of the OEO may be fully monolithically integrated. To illustrate how this may be achieved, FIG. 1 shows a monolithically integrated laser diode 100 formed within a semiconductor waveguide structure having a PIN diode structure including a p-type semiconductor 102, an n-type semiconductor 104, and an active layer 105 between the p-type and n-type semiconductor regions. Light is generated at the active layer 105 and may be emitted at a first end 150. An opposing second end 152 of the structure may be coated with an anti-reflective (AR) coating 108 in order to prevent loss of light generated at the active layer 105.

The waveguide structure (extending from the first end 150 to the second end 152) may effectively be thought of as having three sections: an optical gain section 110 at the first end 150, an optical feedback generation section 130 at the second end 152, and an optical phase modulation (PM) section 120 in between the gain and feedback sections. An optical signal 160 is emitted from the first end 150 of the structure.

The gain section 110 may be formed using the semiconductor materials of the PIN diode structure. For example, the gain section may be a semiconductor optical amplifier (SOA) formed in the active layer 105 and having a multi-quantum well (MQW) structure 115. The gain section may be current modulated by an electrical bias control, represented in FIG. 1 by first current source 142, to produce the gain at a desired optical wavelength. The achieved optical gain in low injection, with appropriate feedback, may provide linear amplification up to a maximum saturated power level.

The phase modulation section 120 may be formed using the same semiconductor materials of the PIN diode structure, and may have a physical length of between about 2 mm to about 3 mm. The phase modulator 120 may be controlled by another electrical bias control, represented in FIG. 1 by second current source 144, to produce the desired effective refraction index in the optical waveguide of the phase modulator. In essence, tuning the phase modulation section 120 changes its effective length in order to bring a property of the optical signal into a stable condition. Tuning of the phase modulation section may have a sensitivity of between about 10-15 degrees/(V*mm) with an applied DC voltage of typically about 6-7 V (and up to about 15 V). This phase sensitivity may be achieved with various devices while sustaining attenuation (signal loss) of about 3 dB/mm or less.

The feedback generation section 130 may be formed from a resonant cavity or distributed feedback (DFB) structure, such as a feedback mirror. In some instances, the feedback may be provided from a diffraction grating 135 of a distributed Bragg reflector (DBR). The DBR may act as a multi-wavelength passband filter for the optical signal, and may have a frequency selectivity of up to about 200 GHz. In other instances, feedback may be provided from a Fabry-Perot (FP) based reflector. The FP reflector may have a frequency selectivity of up to about 2,000 GHz. The reflectance frequency of the feedback generation section 130 may be designed in order to match the gain spectrum of the amplifier in the gain section 110.

Fabrication of an MQW laser may be performed using compound semiconductor materials. For instance, the PIN diode structure may be formed from indium phosphide (InP). The MQW structure may be formed from layers of indium gallium arsenide phosphide (InGaAsP). Other compounds that may be used include HBT/HEMT-based AlGaAs/GaAs, InGaAsP/InP or InAlAs/InP based ultra-high-speed electronics. In yet further examples, a different III-V or II-VI semiconductor compound may be utilized. These compounds may further be used in order to form the other monolithically integrated components of the present disclosure.

Figure 2:
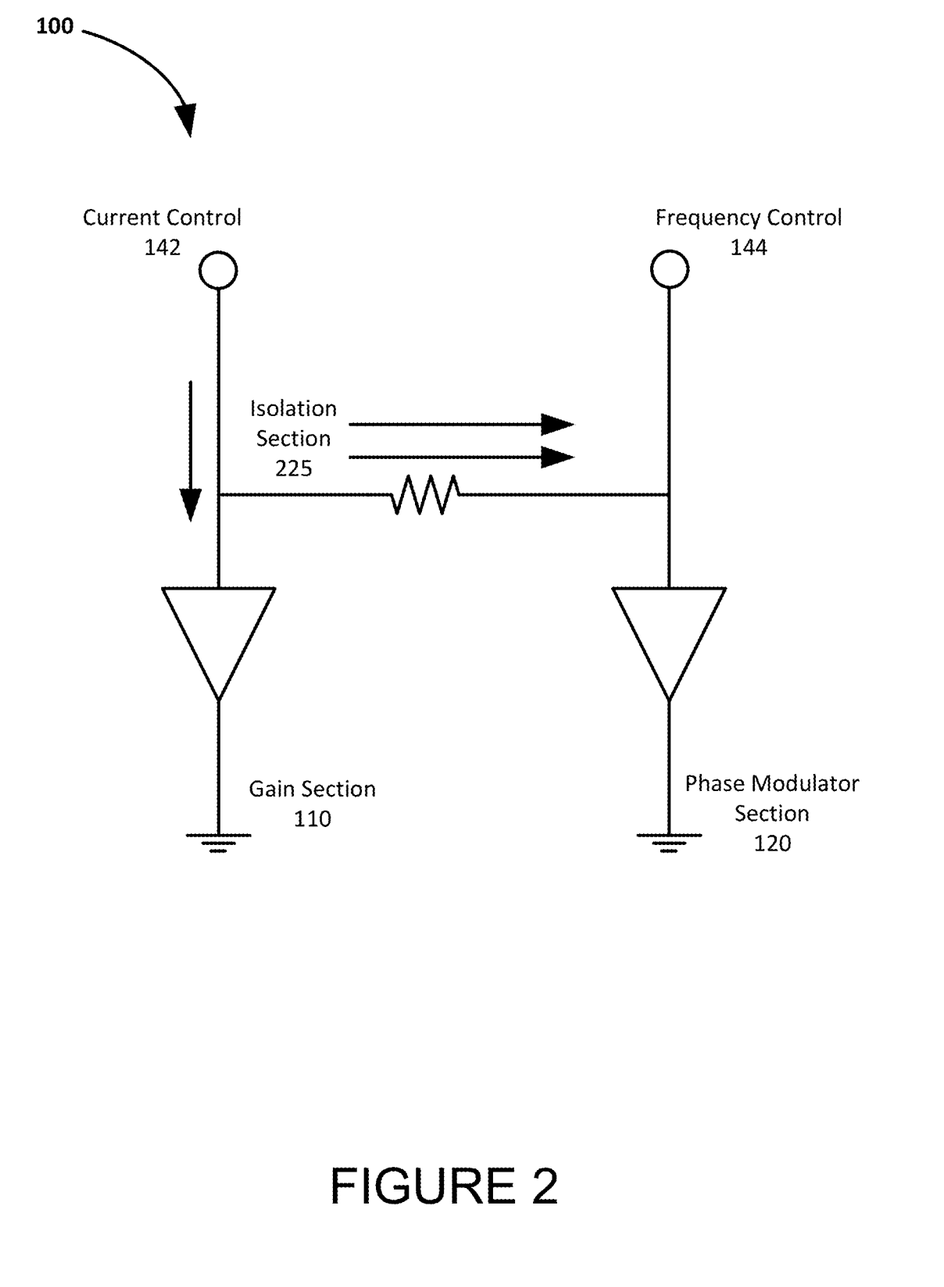
FIG. 2 is an equivalent circuit model of the laser of FIG. 1.

FIG. 2 shows a circuit equivalent of the laser diode 100 of FIG. 1. As seen in FIG. 2, each of the gain section 110 and the phase modulation section 120 are respectively controlled by a first current source 142 and a second current source 144. Furthermore, although the gain section 110 and phase modulation section 120 are monolithically integrated with one another, the section are electrically separated from one another by an isolation section 225 having an effective resistance, in order that each current source 142, 144 should bias its designated section and not bias the other section.

In operation, the MQW structure 115 of the gain section 110 may provide a high gain over a broad optical spectrum, and further may yield a multi-mode optical signal having a large number of inter-modal oscillations. For instance, the laser diode 100 may be configured to operate at or about a wavelength of—or a range of wavelengths centered at or about—1550 nm, and the gain section 110 may be current modulated by the first current source 142 to produce the gain at optical wavelengths around 1550 nm. The inter-modal oscillations may be between about 3 GHz to 300 GHz.

An RF frequency optical signal may be generated from the inter-modal oscillations of the multi-mode optical signal by way of heterodyne photodetection. This results in the intermodal separation frequencies being effectively considered as a free-running RF signal. Anywhere from near IR to UV region optical wavelengths may be generated by the presently disclosed design if the appropriate combinations of heterojunction compound materials are used.

Inter-modal frequency separation may be defined by $\Delta v$, where $\Delta v = 1/2\tau$, and $\tau$ is the travel time for the optical signal in the optical resonant cavity structure. This means that as the optical travel time increases, the separation between inter-modal frequencies decreases. For instance, a short (50 µm) Fabry-Perot resonator results in a limited number of modes at inter-modal separation frequencies of 1000 GHz. By contrast, a long (5 mm) FP length results in a large number of modes under the gain spectra at inter-modal separation frequencies of 10 GHz. In this regard, it can be seen that the inter-modal separation frequency of a laser can be adjusted by affecting the travel time of the optical signal through the connected resonant cavity, for instance, by affecting the index of refraction of the optical waveguide in the phase modulation section 120.

In practice, the inter-modal separation frequencies between various modes of a multi-mode optical signal are subject to variation. This variation leads to drift in the optical signal over time. Hence the need for forced oscillation in order to prevent phase drift in the multi-mode signal. In particular, it is generally sought for the phase conditions to meet the Barkhausen oscillation conditions in order to the phase modulator to effectively adjust the inter-modal separation frequency in a manner that minimizes its drift. In this sense, the forced oscillation feedback may be configured as in a tunable N-push oscillator configuration in order to dynamically compensate for phase error created by the differences in inter-modal separation frequency among modes of the multi-mode optical signal. This is turn results in positive feedback to the laser gain section, thereby strengthening the high frequency optical signal.

As described later in the disclosure, the bias applied to each of the gain section 110 and the phase modulation section 120 may be used in order to produce the aforementioned forced oscillations at the laser diode 100 and thus minimize drift in the optical signal. Either a low frequency and a high frequency modulation may be applied. Output power, wavelength tuning, and forced oscillation can be made to the respective segments of the laser. In effect, using the current control 142 and frequency control 144 inputs, the laser diode 100 may be tuned to each of a desired gain and a desired wavelength. Thus, FIG. 2 demonstrates the ability for the monolithically integrated laser diode 100 of FIG. 1 to provide a stable yet tunable multi-mode long cavity laser.

It should also be noted that the circuit diagram of FIG. 2 is an electrical model of the optical arrangement of FIG. 1, and this may be used to model and estimate electrical properties of the optical arrangement of FIG. 1. Furthermore, the electrical model of FIG. 2 can be modeled in combination with other electrical models, such as for a tunable N-push oscillator configuration, in order to better estimate close-in to carrier phase noise for the laser.

Figure 3:
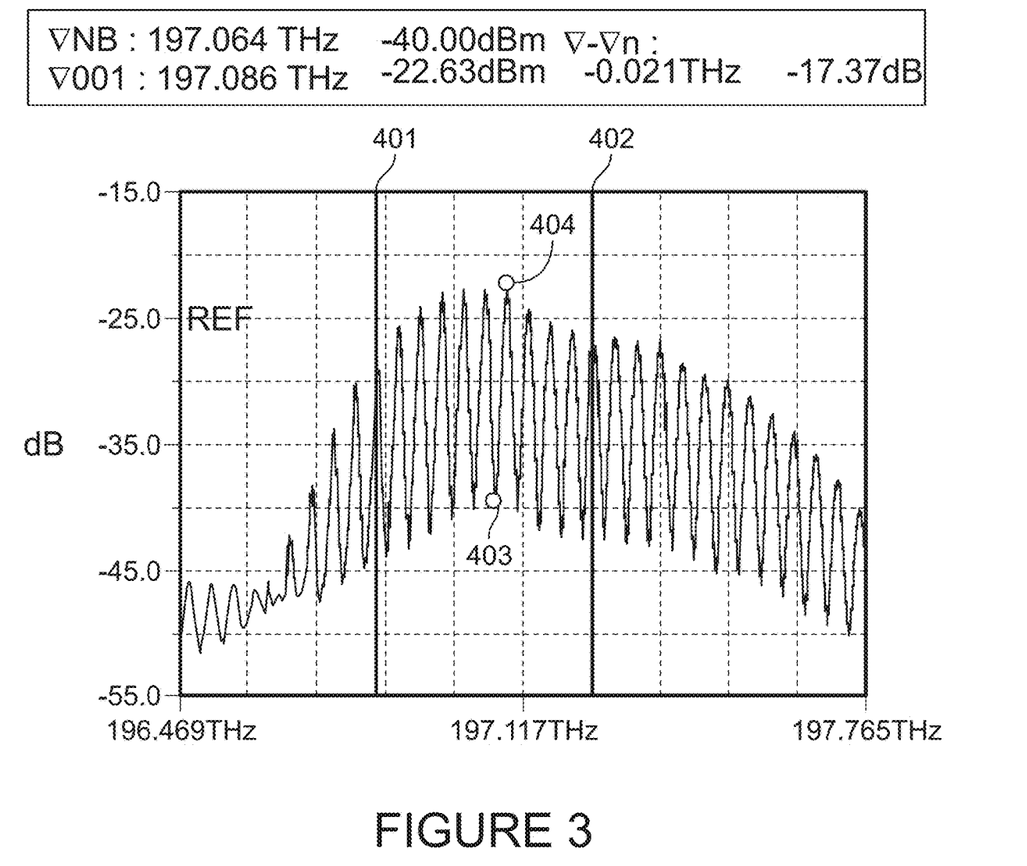
FIG. 3 is a graphical representation of an optical spectrum of the laser of FIG. 1.

FIG. 3 is a graphical representation of an optical spectrum of an optical signal emitted by the laser diode 100 of FIG. 1 across a range of optical frequencies centered at or about 200 THz (corresponding approximately to the aforementioned 1550 nm wavelength). The optical signal may be measured using an optical spectrum analyzer. Alternatively, the inter-modal oscillations of the optical signal may be detected using an ultra-high-speed photodiode.

In can be seen from FIG. 3 that several inter-modal frequencies are produced as a result of a built-in optical delay present in the resonant feedback structure 135 of the feedback generation section. In particular, FIG. 3 shows over 10 modes that are excited in the multi-mode laser diode 100. The two vertical lines 401 and 402 are aligned with TEM modes having strong lasing power (e.g., better than −27.0 dB attenuation). The total frequency separation between lines 301 and 302 is about 0.4070 THz. Two data points 303 and 304 correspond to adjacent local maximum and minimum points, and have a total frequency separation of −0.021 THz. Lines 301 and 302, along with data points 303 and 304, indicate that the inter-modal frequency separation between modes of the optical signal is about 40 GHz. Thus, the stable heterodyned photo-detected RF signal one would expect to generate from the output of the laser diode would be about 40 GHz.

It should be noted that the results shown in FIG. 3 correspond to the DBR-based feedback structure shown in FIG. 1. Similar results may be yielded from an FP-based feedback structure. In the case on an FP feedback structure, delays associated with millimeter range FP lengths may be in the order of tens of picoseconds. Hence, under this condition, the RF oscillations produced by the built-in delay of the FP structure would similarly result in inter-modal separation frequencies of about 40 GHz.

Because the signal shown in FIG. 3 is free-running, it can suffer from high levels of frequency instability (e.g., a 1 hr frequency drift of over 11 MHz). In order to achieve improved frequency stability, biases may be applied to each of the gain section 110 and the phase modulation section 120 to produce forced oscillations at the laser diode 100, as discussed above in connection with FIG. 1. These forced oscillations may by the product of a self-IL feedback loop, self-PLL feedback, or combination of the two.

Figure 4:
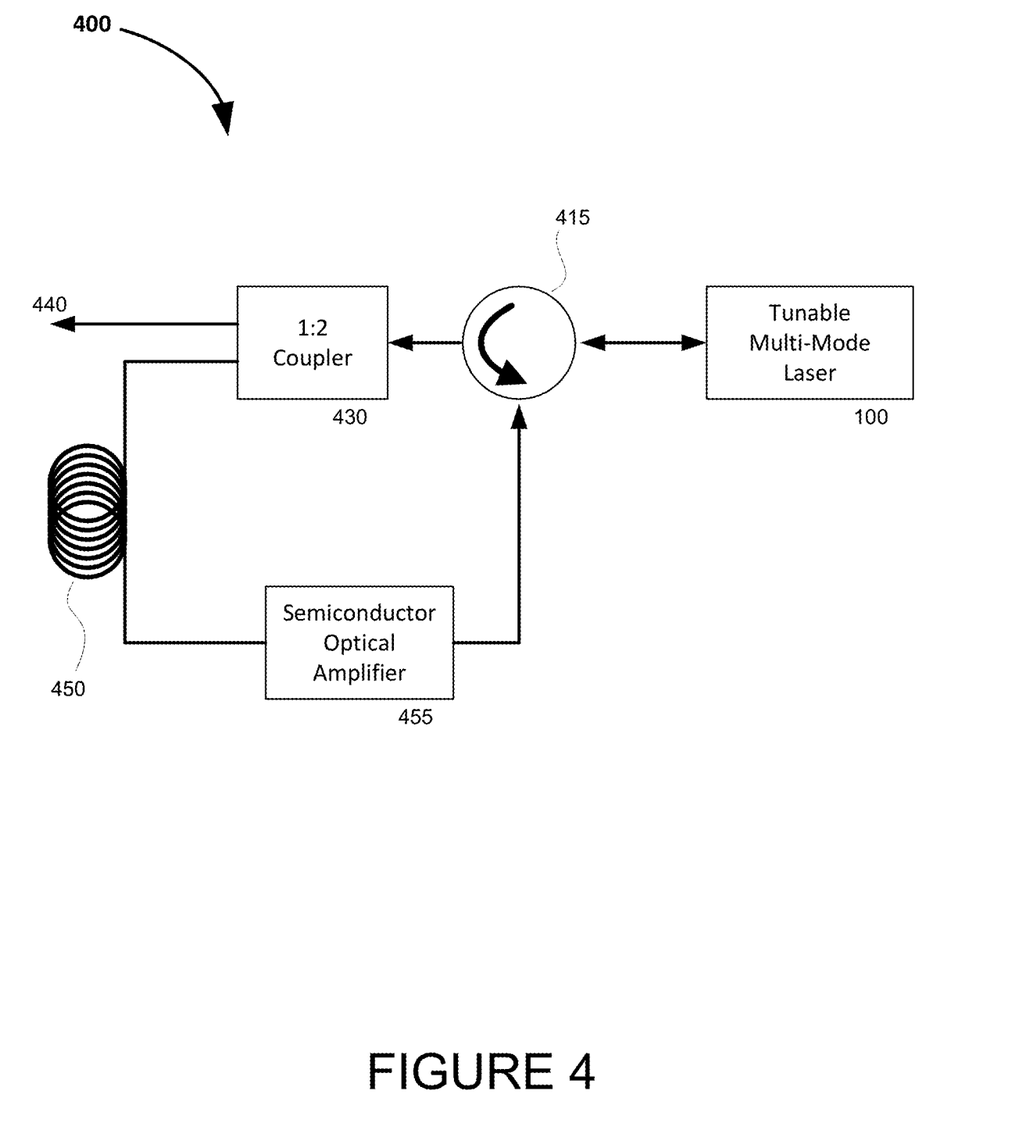
FIG. 4 is a functional diagram of a self-injection locked tunable multi-mode laser in accordance with an aspect of the present disclosure.

FIG. 4 is an example circuit 400 using a self-IL feedback loop to stabilize a multi-mode laser. In FIG. 4, an example circuit 400 is connected to a tunable multi-mode laser, such as (but not limited to) the laser 100 shown in FIG. 1. The circuit 400 is purely optical, and utilizes a delay line 450 to provide feedback to the laser 100. In some instances, the delay line 450 may be an optical fiber cable, and may have a length of or on the order of about 3.5 km. Dispersive photonic crystal fiber, or chirped fiber Bragg gratings may be used to create a suitable delay in the fiber cable. Other examples may utilize shorter or longer delay lines as disclosed in the relevant art regarding self-IL. In other instances, the delay line may be a high energy storage resonator, as discussed in greater detail below. The delay line 450 loops shown in FIG. 4 are intended merely to represent a time delay, and are not necessarily indicative of a particular length of the particular delay element being used in the delay line 450.

The output of the laser 100 is passed through one or more optical devices, such as a circulator 415 and optionally a coupler 430. In the example of FIG. 4, the circulator 415 provided has low forward insertion loss and high reverse isolation. If provided, the coupler 430 may be a monolithically integrated directional coupler with either equal (i.e., 50:50) or unequal split (10:90). One branch 440 out of the coupler 430 may be used to monitor properties of the output of the multi-mode laser 100 (e.g., optical characteristics, intermodal oscillation frequency characteristics, etc.), or to output the optical signal to another component. Such monitoring may further require optical detection and display systems to be provided. The other branch out of the coupler 430 may be fed to the delay line 450. At least a portion of the optical signal may optionally be fed to an amplifier 455, such as a semiconductor optical amplifier, and finally fed back into the circulator 415. For example, the amplifier 455 may be included in the delay line 450 in the feedback loop causes the optical signal to become significantly attenuated (e.g., about 6 dB or more, about 10 dB or more).

The circulator 415 then feeds the delayed amplified optical signal back into the modulator of the laser 100. This may be performed as a function of time. Furthermore, the signal may be fed into distinct optical lines associated with each of the current control source 142, and frequency control source 144. The optical lines may be configured to provide control functions for each of the sources 142, 144. In some instances, the optical signal may further be split (e.g., using a coupler) in order to provide an optical output for use external to the laser 100 and oscillator (e.g., relevant applications of the technology, further monitoring).

In operation, the delay line 450 of the circuit 400 acts as a noise minimizing component by forcing entrainment of real-time free-running oscillation to a delayed copy of itself. The required delay for noise minimization in the optical circuit is on the order of between 0.1 μs and 100 μs.

As noted above, the elements of the experimental setup 400 shown in FIG. 4 are all optical in nature. This is unlike in the self-IL feedback arrangement described in the '369 patent, in which the optical output of the laser is converted to an electrical signal, amplified, provided to an RF oscillator, and then fed back into the laser as an electrical input. Phase error corrections can be made in either the electrical domain or in the optical domain. In the case of electrical domain corrections, an electrically controlled phase shifter—dispersive or non-dispersive—may be used. In the case of optical domain corrections, any one of a Mach-Zhender modulator (with adjustable operating point) or an optical phase modulator (based on changes in bias voltage) may be used. The examples of the present application mainly focus on use of an optical phase modulator, since this approach is often the most efficient. Changing the operation bias of a Mach-Zhender modulator can cause non-linear amplitude modulation and thus add to harmonic distortion. A third possibility is to use a tunable optical transversal filter for adjusting a center wavelength passed by the filter. The band pass characteristics of the optical transversal filter. This may further be combined with a tunable Yttrium-Iron-Garnet (YIG) filter used for narrowband filtering of the oscillating signal. These optical filters may be included with the optical phase modulator, and can introduce additional degrees of freedom in phase locking and filtering in the optical domain.

In summary, the self-IL input can force the multi-mode laser diode to operate in a stable manner. This arrangement can significantly reduce far-away carrier phase noise of the generated inter-modal separation frequency. Furthermore, the level of self-IL fed back into the laser diode may itself be adjustable by controlling the amplifier 455.

Figure 5:
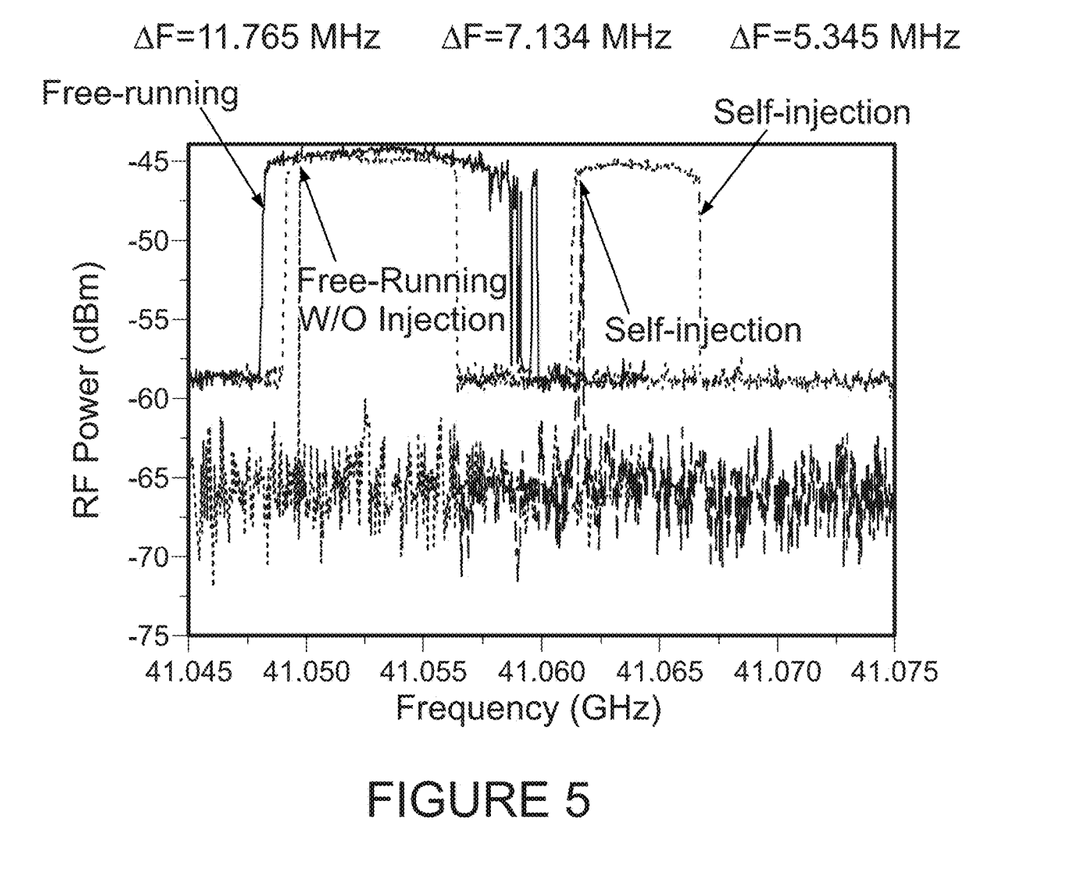
FIG. 5 is a graphical representation of performance of the self-injection locked tunable multi-mode laser of FIG. 4 across a range of frequencies.

FIG. 5 is a graphical representation of RF power outputted by tunable multi-mode laser under both free-running and self-injection (self-IL) conditions, plotted across a range of frequencies. In the example of FIG. 5, a 3.5 km long fiber optic delay line is used for self-IL, resulting in approximately a 17.5 microsecond delay. As with the example of FIGS. 1-3, the inter-modal separation frequency of the tunable multi-mode laser is about 40 GHz at various optical injection power levels and for various optical amplifier gains.

Curve 501 of FIG. 5 shows RF power characteristics for a free-running oscillation (no injection) lasting about 1 hour. The free-running oscillation yields high noise and produces a frequency drift across a bandwidth of about 12 MHz (from about 41.048 GHz to about 41.060 GHz). By comparison, frequency stability of an oscillation having self-IL feedback lasting for over 1 hour has a reduced frequency drift. In particular, curve 502 shows RF power characteristics for the self-IL oscillation at an optical amplifier power level of 2 dB. This results in a frequency drift of about 7 MHz (from about 41.049 GHz to about 41.056 GHz) over the 1 hour. Curve 503 shows RF power characteristics for an oscillation having self-IL feedback at an optical amplifier power level of 5 dB. This results in a frequency drift of only about 5 MHz (from about 41.061 GHz to about 41.066 GHz). Thus, it can be seen from the results of FIG. 5 that self-IL causes a frequency detuning of the 40 GHz inter-modal oscillation generated by the multimode laser due to the forced interaction of the feedback signal.

In addition to the principles of self-IL shown in FIGS. 4 and 5, principles of self-PLL may be applied to the oscillator to force stable oscillations. In the case of a self-PLL feedback loop, the optical signal is divided between two or more paths having different, aharmonically related delays. In order for these delays to be phase compared, the optical signals are converted to the electrical domain and then fed into a phase comparator. The product of the comparator may be a combined processed signal having reduced phase noise characteristics, which may then be fed to the laser diode, and particularly used to bias the gain and phase modulation sections of the laser diode. This arrangement can significantly reduce close-in carrier phase noise within the locking range of the oscillator.

Unlike, the self-IL loop described above in connection with FIG. 4, the self-PLL loop is not purely optical. However, the self-PLL loop is also not like the self-PLL feedback arrangement described in the '369 patent, in which the comparator output is provided to an RF oscillator, and subsequently fed back into the laser. Since the self-PLL feedback is used to stabilize the inter-modal frequency of the multi-mode laser output, the feedback may be fed directly based into the laser diode as a bias for each of the gain and phase modulation sections.

Figure 6:
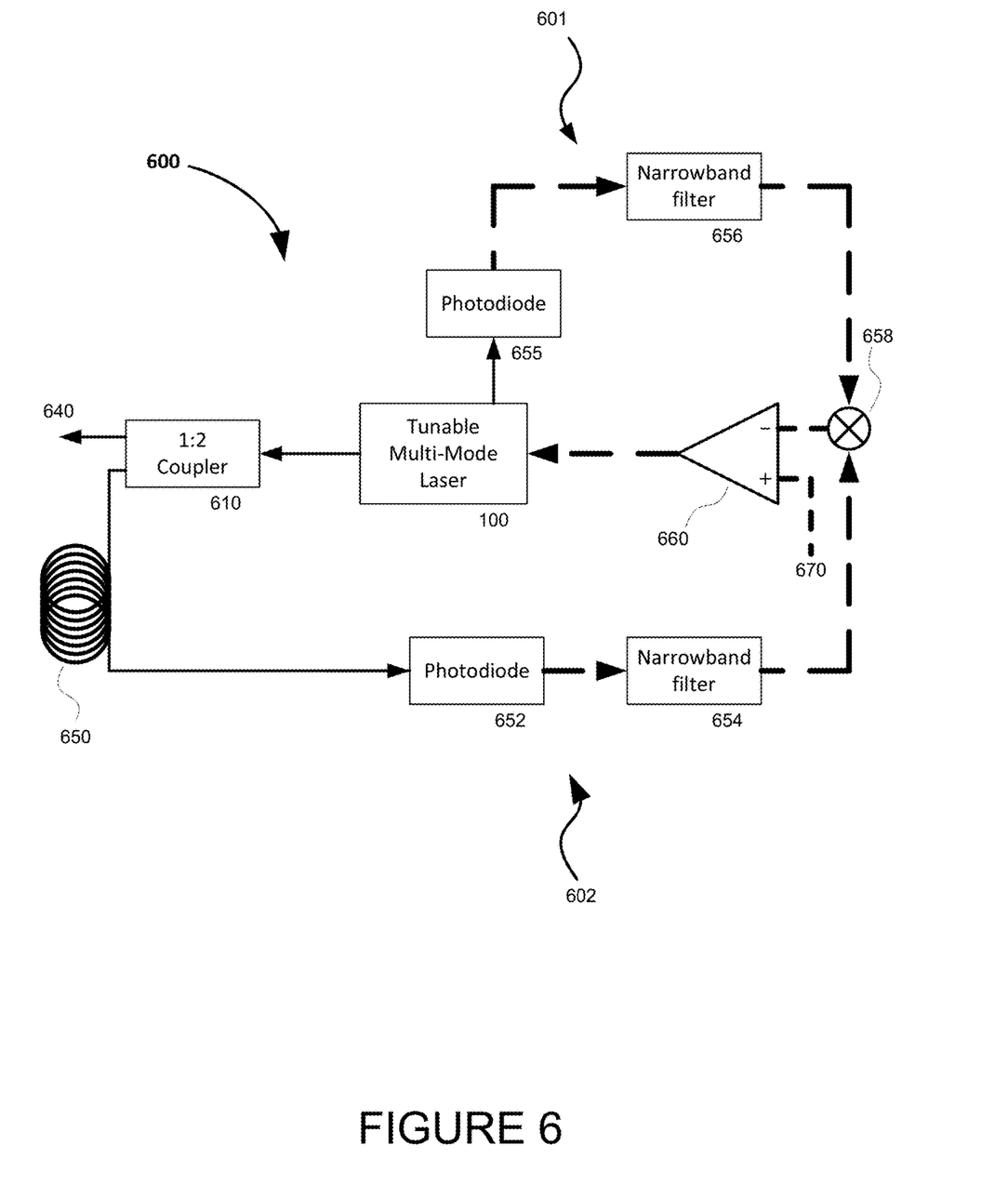
FIG. 6 is a functional diagram of a self-phase-locked looped tunable multi-mode laser in accordance with an aspect of the present disclosure.

FIG. 6 is a functional diagram of a self-PLL arrangement 600 for phase locking an inter-modal oscillation of a tunable multi-mode laser 100. In FIG. 6, optical signals are shown by solid lines and electrical signals by dashed lines.

The circuit 600 uses real-time phase error detection between non-delayed 601 and delayed 602 versions of the intermodal oscillation frequency. On the non-delayed end 601, the laser output is converted to an electrical signal using an optical detector such as a photodiode 655, or other optical-to-electrical converter for converting an optical signal from the optical domain to the electrical domain, and then provided to a narrowband filter 656. The filter may be set to a desired band depending on the properties of the laser. In the particular examples of the present application, in which RF oscillations of about 40 GHz are produced, the narrowband filter may be centered at or about 40 GHz. The filtered input is used as a reference signal from the comparator 658.

On the delayed side 602 of the circuit 600, the laser output is optionally provided to a coupler 610. In the presence of the coupler, the coupler output is split into two signals in a manner similar to the coupler of FIG. 4, for example using one branch 640 of the split to monitor or output the optical signal. At least a portion of the optical signal is then passed through a delay line 650 before being converted to an electrical signal using an optical detector such as a photodiode 652, or other optical-to-electrical converter for converting an optical signal from the optical domain to the electrical domain. The delay line 650 may be the same or similar as the delay line 450 discussed in connection with FIG. 4. The photodiode output is provided to a narrowband filter 654 centered at the same frequency as the reference end narrowband filter 656 (e.g., in the present application, 40 GHz), and then the filtered electrical signal to the comparator 658. The phase mixer 658 (shown as a multiplier circuit in the example of FIG. 6) then combines the undelayed (reference) and delayed signals, and provides the result to an amplifier 660 (where it is compared to a reference signal 670), and finally provided back to the tunable laser 100. The result of the arrangement of circuit 600 is a phase-locked signal having improved stability.

Figure 7:
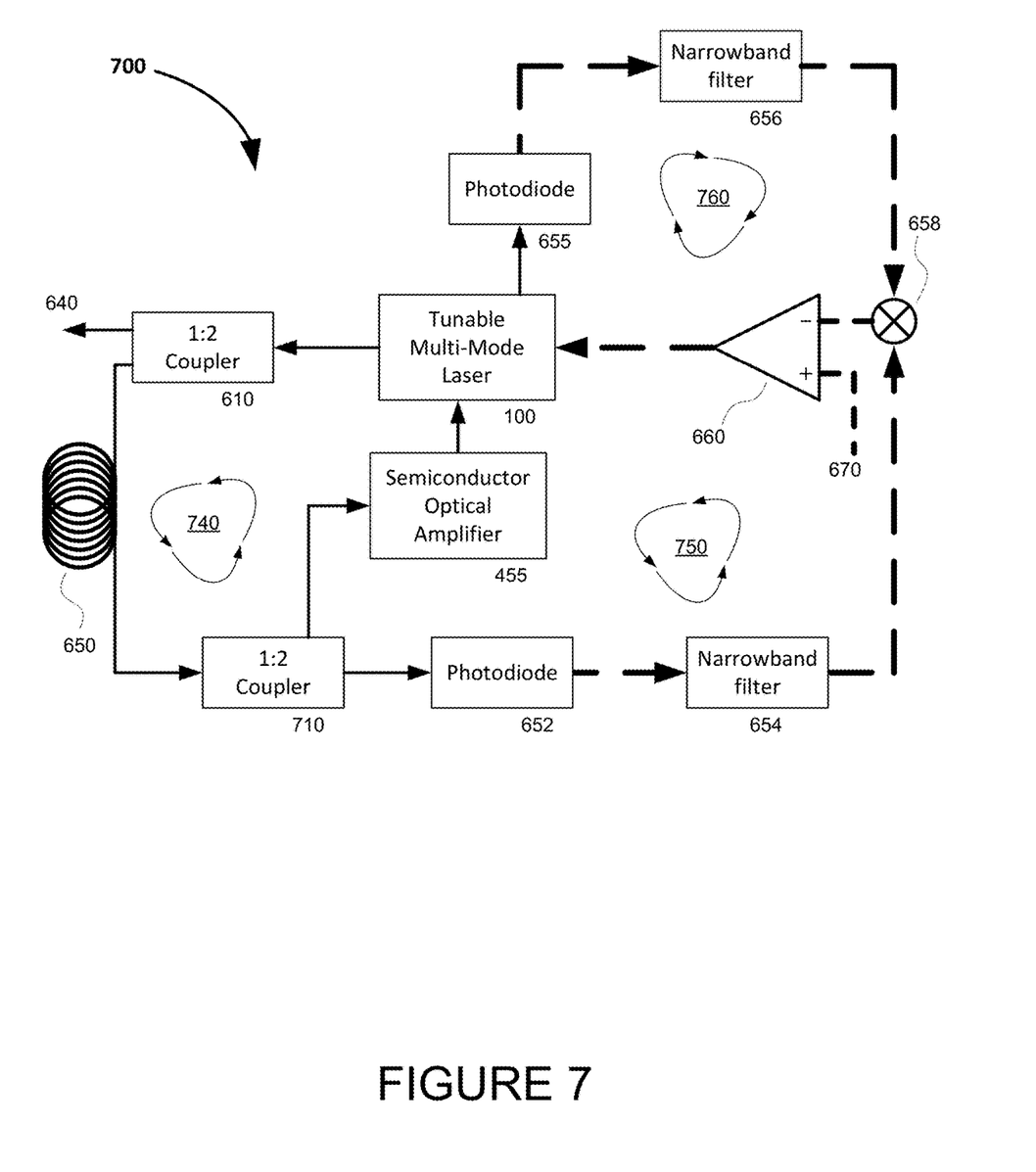
FIG. 7 is a functional diagram of a self-injection locked self-phase-locked looped tunable multi-mode laser in accordance with an aspect of the present disclosure.

The self-IL principles of FIGS. 4 and 5, and the self-PLL principles of FIG. 6 are combined in FIG. 7 into a circuit 700 having a combined self-IL self-PLL arrangement. For the sake of simplicity, it is noted that most of the elements of the circuit 700 can be the same as in the arrangement 400 of FIG. 4 and the arrangement 600 of FIG. 6. Particularly, the phase locking elements (e.g., optional couplers 430 and 610 with respective branches 440 and 640, delay lines 450 and 650, delayed 740/750 and non-delayed 760 versions of the laser output, photodiodes 652 and 655, filters 654 and 656, phase mixer 658, and amplifier 660 with reference signal 670, and optionally optical amplifier 455) can be the same or similar. In addition to these components, the self-IL self-PLL circuit 700 includes a second coupler 710 positioned in the delay section 602 of the circuit 700 after the delay line 650 but before the optical signal is converted to an electrical signal at photodiode 652. This is because the delayed optical signal can be used for both self-IL and self-PLL purposes, as demonstrated in FIGS. 4 and 6. The second coupler 710 splits the optical signal in the desired manner (e.g., 50:50, 90:10, etc.) into two branches, a first branch feeding the self-IL loop 740 of the circuit 700, and a second branch feeding a first self-PLL loop 750 of the circuit 700 (corresponding to loop 601 of FIG. 6). A second self-PLL loop 760 (corresponding to loop 602 of FIG. 6) is fed directly from the laser 100 without passing through a delay line 650.

In the self-IL loop 740, a first portion of the optical signal is fed back to the tunable multi-mode laser 100. The manner in which the optical signal is fed back to the laser 100 may be the same or similar to the description in connection with FIG. 4 (e.g., using a circulator (not shown in FIG. 7)).

In the self-PLL loop 760, a second portion of the delayed optical signal is converted to the electrical domain, compared to the non-delayed signal from the laser 700. The result of the circuit 700 is that the locked optical signal has both reduced far-away from carrier phase noise and reduced close-in to carrier phase noise within the locking range of the oscillator. Essentially, this arrangement achieves better stability and performance compared to a free-running oscillation technique, with less frequency drift even over long durations of time.

For purposes of implementing the above-described advances in a monolithically integrated fashion, the delay line (e.g., delay lines 450 and 650 of FIGS. 4, 6 and 7) should itself be a monolithically integrated delay element. This may be accomplished using a micro-resonator. The micro-resonator may be selected to have a high quality factor at the desired operational wavelength of the circuit. For instance, the micro-resonator may be a micro-disk resonator with a very high quality factors (on the order of between $10^6$ and $10^8$). In another instance, the micro-resonator may be a whispering gallery mode (WGM) resonator having a quality factor in the order of about $10^{11}$. The quality factors specified above are at an operating wavelength of the circuit, such as at a wavelength of about 1550 nm (corresponding to an optical delay of about 250 μs).

The amount of delay in the WGM resonator may be adjusted by adjusting the loaded quality factor. In some instances, the quality factor of the WGM resonator may itself be varied or tuned, such as by including an electro-optic based material (e.g., Si—Ge) having a variable index of refraction. The index may be varied based on an applied external electric field. This can in turn cause the resonant frequency of the resonator to change, which can cause a change to the quality factor.

In one example, the micro-resonator may be a toroidal resonator having a radius of about 60 microns, such as the resonator described in D. K. Armani, T. Kippenberg, S. M. Spillane and K. J. Vahala "Ultra-high-Q toroid microcavity on a chip" Nature, vol. 421, pp. 925-929, 27 Feb. 2003. In another example, the micro-resonator may be a ring resonator having a diameter of about 10 microns, such as the resonator described in L. Tobing and P. Dumon, "Fundamental Principles of Operation and Notes on Fabrication of Photonic Microresonators", Research and Applications, 156, pp. 1-27 (2010). The resonator may be integrated with input and output optical waveguides using techniques known in the art.

In another example, multiple resonators may be included in order to increase frequency selectivity. In such an instance, the resonators may be designed with a relatively lower Q (compared to the example of using a single WGM resonator). The resonators may be aligned in a cascaded fashion.

In another example, in place of using a basic optical waveguide coupled to a WGM resonator delay line, a dispersive optical waveguide could be implemented using photonic bandgap (PBG) engineering as a photonic crystal (PhC). The delay element may include one or more photonic bandgap fibers.

The optical waveguides, optical couplers, optical delay elements and electronics for phase error detection and control described in the above examples may be monolithically integrated, such as on a silicon germanium (SiGe) or Silicon (Si) substrate using heterogeneously integrated silicon-based photonics. In one example, a feedback amplifier using SiGe heterojunction bipolar transistor (HBT) devices or SiGe CMOS technologies may be used. The narrow band filtering may include either active filtering or passive filtering functions. The microfabrication processes of Si-photonics combined with low noise Si based low noise Bi-CMOS circuits may result in optoelectronic oscillators with phase noise approaching −150 dBC/Hz at 10 kHz offset. This expected result is based on the analytical modeling of multi-mode coupled oscillations locked to one another as described in commonly owned U.S. Pat. No. 7,088,189.

The above examples demonstrate the use of a single delay line to achieve both self-IL and self-PLL feedback to an optical signal generator. However, those skilled in the art will readily appreciate that multiple delay lines may be provided in order to achieve multiple self-IL and self-PLL functions, as demonstrated in L. Zhang, A. Poddar, U. Rohde, A. Daryoush, "Analytical and Experimental Evaluation of SSB Phase Noise Reduction in Self-Injection Locked Oscillators Using Optical Delay Loops," *IEEE Photonics Journal*, Volume 5, Number 6, December 2013. Furthermore, multiple delay elements of self-multiple-IL (such as dual semi-digital IL delay lines) or multiple delay elements of self-multiple-PLL (such as dual semi-digital PLL delay lines) may be used individually or combined to build a self-multiple-ILPLL feedback element for forcing oscillations at the tunable laser. In some instances, the multiple delay lines may be accomplished using WGM resonators having different loaded quality factors.

Although the present disclosure describes using self-locking mechanisms to control optical signal oscillations, it will also be understood that the self-locking mechanisms may be combined with additional reference-based mechanisms, such as a PLL feedback loop relying on an external reference to lock the optical signal oscillations. External reference signals may be generated by, for example, quartz crystal oscillators or atomic clocks, and may further be combined with frequency multipliers and dividers to bring the external reference clock frequency within sufficient proximity of the inter-modal separation frequency in order to force stable oscillation of the optical signal. The voltage reference 670 shown in each of FIG. 6 and FIG. 7 may be thought of as representative of an external reference for achieving frequency stability.

Using the above-described techniques, each of the above example circuits 400, 600, 700 is capable of generating a stable repetitive optical signal at microwave or even millimeter-wave frequencies. The monolithically integrated structures of the circuit designs are further capable of operating over a range of wavelengths, including dominant telecommunication wavelengths (e.g., at or around 1550 nm). They also take up less space than non-fully integrated designs, such as those including fiber cable delay lines as compared to a high Q, high energy storage resonator.

The oscillators of the present disclosure are capable of maintaining frequency channels close to one another while at the same time exhibiting noise reduction, phase control and phase error reduction, and bit-error rate reduction sufficient enough to keep closely packed frequency channels apart. Keeping frequency channels apart is especially important for cellular technologies that rely on high-order frequency division, such as orthogonal frequency-division multiplexing (OFDM) or high-order phase-shift keying (PSK). The optoelectronic oscillators of the present disclosure may also be utilized in base stations, radar systems, high resolution remote sensing systems, timekeeping systems, or frequency synthesizers.

Additionally, fabrication of these structures is cost effective, since many of the components (e.g., phase modulator, semiconductor optical amplifier gain section, reflective feedback section) can be integrated with one another, making the manufacture process for tunable multi-mode lasers more efficient. These fabrication and operation techniques also lead to reduced thermal sensitivity in OEO and optical resonator design.

These circuits have numerous applications, and may be used as a stable clock for electrical and optical sampling of broadband information in analog to digital converters, as well as a number of other digital processing functions, such as by using a sample and hold technique. RF oscillators with high frequency and phase stability are also required in order to achieve both narrower channel resolution (due to, e.g., reduction of phase noise) as well as a more precisely locked frequency (due to, e.g., reduced temperature sensitivity) than that achieved by previously known systems. As a result, the example devices of the present disclosure provide for a lower bit error rate for data that is transmitted over a given communication bandwidth, such as the communication bandwidths in phase shift keyed or quadrature amplitude modulated communication systems.

In summary, the circuits described herein are a cost-effective solution for generating an optical signal that is suitable for advanced cellular systems such as broadband MIMO, UWB, 5G LTE, IEEE 802.11AD, etc.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

Additional Examples of the Technology

Example 1. A device comprising:
a tunable multi-mode laser configured to generate a multi-mode optical signal at a tuned wavelength; and
a feedback loop coupled to the tunable laser to receive the optical signal and including at least one delay line, wherein an output of the delay line is fed back to the tunable multi-mode laser in order to provide at least one of self-injection locking and self-phase locked looping for the multi-mode tunable laser,
wherein the multi-mode tunable laser includes, at a first end of the multi-mode tunable laser, a semiconductor optical gain region;
at a second end of the multi-mode tunable laser, a feedback region including a feedback mirror configured to sustain an optical signal at a plurality of wavelengths separated by an inter-modal separation frequency; and
between the semiconductor optical gain region and feedback region, a phase modulation region configured to control a phase of the optical signal transmitted through the phase modulation region,
wherein the output of the delay line fed back into the laser is configured to bias each of the optical gain region and phase modulation region in order to reduce phase drift of the optical signal.

Example 2. The device of Example 1, wherein the multi-mode tunable laser is formed from a PIN structure having a p-type semiconductor region, an n-type semiconductor region, and an active layer between the p-type and n-type semiconductor regions, and wherein the semiconductor optical gain region includes a multi-quantum well structure formed along the active layer.

Example 3. The device of Example 2, wherein the PIN structure is formed from indium phosphide, and wherein the multi-quantum well structure is formed from one of an indium gallium arsenide phosphide alloy or an indium aluminum arsenide alloy.

Example 4. The device of any one of Examples 1-3, wherein the inter-modal separation frequency of the wavelengths of the optical signal is about 40 GHz.

Example 5. The device of any one of Examples 1-4, wherein the feedback mirror of the feedback region is one of a distributed Bragg reflector or a Fabry-Perot resonator.

Example 6. The device of Example, wherein the phase modulation region includes a phase modulator having a sensitivity of about 15 degrees/(V*mm) under an applied voltage of between 6-7 volts.

Example 7. The device of any one of Examples 1-6, wherein the feedback loop is a self-injection locking component including the delay line and further including:
a semiconductor optical amplifier configured to amplify an output of the delay line; and
an optical combiner configured to receive each of the optical signal generated by the laser and the output of the delay line, and to feed the output of the delay line output back into the laser.

Example 8. The device of Example 7, wherein the laser includes a first current source for controlling gain at the optical gain region, and a second current source for controlling phase modulation at the phase modulation region, wherein each of the first current source and second current source are electrically isolated from each other, and wherein the optical combiner is configured to feed the output of the delay line into each of the first current source and the second current source.

Example 9. The device of any one of Examples 7-8, wherein the semiconductor optical amplifier has gain of about 2 dB, wherein the feedback loop is configured to reduce a frequency drift of the optical signal over a duration of 1 hour from more than 11 GHz to less than 8 GHz.

Example 10. The device of any one of Examples 7-8, wherein the semiconductor optical amplifier has gain of about 5 dB, wherein the feedback loop is configured to reduce a frequency drift of the optical signal over a duration of 1 hour from more than 11 GHz to less than 6 GHz.

Example 11. The device of any one of Examples 1-6, wherein the feedback loop is an optoelectronic self-phase locked looping component including the delay line and further including:
a first optical-to-electrical converter configured to receive an undelayed version of the optical signal from the laser and to convert the received signal from an optical domain to an electrical domain;
a first electrical line configured to receive the converted undelayed signal from the first optical-to-electrical converter;
a second optical-to-electrical converter configured to receive a delayed version of the optical signal from the delay line and to convert the received signal from the optical domain to the electrical domain;
a second electrical line configured to receive the converted delayed signal from the second optical-to-electrical converter; and
a phase mixer coupled to each of the first and second electrical lines and configured to combine the undelayed and delayed converted signals in to a combined signal, wherein the device is further configured such that the combined signal is fed back into the laser.

Example 12. The device of Example 11, further comprising an amplifier coupled to an output of the mixer and configured to amplify the combined signal, wherein the device is configured such that the amplified combined signal is fed back into the laser.

Example 13. The device of any one of Examples 11-12, wherein each of the first and second electrical lines includes a narrowband filter for filtering the undelayed and delayed converted signals, respectively, and wherein each narrow band filter is centered at a same frequency selected based on the intermodal separation frequency.

Example 14. The device of any one of Examples 1-6, wherein the feedback loop is an optoelectronic self-injection locking self-phase locked looping feedback loop including:
a self-injection locking component including:
a semiconductor optical amplifier configured to amplify an output of the delay line; and
an optical combiner configured to receive each of the optical signal generated by the laser and the output of the delay line, and to feed the output of the delay line output back into the laser; and
a self-phase locked looping component including:

a first optical-to-electrical converter configured to receive an undelayed version of the optical signal from the laser and to convert the received signal from an optical domain to an electrical domain;

a first electrical line configured to receive the converted undelayed signal from the first optical-to-electrical converter;

a second optical-to-electrical converter configured to receive a delayed version of the optical signal from the delay line and to convert the received signal from the optical domain to the electrical domain;

a second electrical line configured to receive the converted delayed signal from the second optical-to-electrical converter; and a phase mixer coupled to each of the first and second electrical lines and configured to combine the undelayed and delayed converted signals in to a combined signal, wherein the device is further configured such that the combined signal is fed back into the laser.

Example 15. The device of any one of Examples 1-14, further comprising an optical coupler coupled to an output of the laser, and configured to split the optical signal generated by the laser, wherein only a portion of the optical signal generated by the laser is provided to the delay line.

Example 16. The device of any one of Examples 1-15, wherein the laser and the delay line are monolithically integrated.

Example 17. The device of Example 16, wherein the delay line includes a delay element selected from one of: a toroidal micro-resonator; or a ring micro-resonator.

Example 18. The device of Example 17, wherein the delay element is a toroidal micro-resonator having a radius of about 60 microns.

Example 19. The device of Example 17, wherein the delay element is a ring-shaped micro-resonator having a diameter of about 10 microns.

Example 20. The device of any one of Examples 17-19, wherein the delay element has a quality factor in the order of $10^{11}$ for a laser operating at a wavelength of about 1550 nm.

Example 21. The device of any one of Examples 17-20, wherein the delay element creates a delay of about 250 μs.

Example 22. The device of Example 16, wherein the delay line includes one or more photonic bandgap fibers.

Example 23. The device of any one of Examples 1-22, wherein the feedback loop includes a plurality of delay lines, each delay line providing at least one of injection locking feedback or phase locked looping feedback to the multi-mode tunable laser.

Example 24. The device of Example 23, wherein at least one of the plurality of delay lines includes a phase locked looping feedback element having an external reference signal to lock oscillations of the optical signal.

Example 25. The device of any one of Examples 1-24, wherein each of the gain, feedback and phase modulation regions of the tunable multi-mode laser is monolithically integrated.

Example 26. An optoelectronic device comprising:

a tunable laser configured to generate an optical signal at a tuned wavelength with a plurality of modes having an inter-modal separation frequency with a range of RF frequencies; and an optoelectronic feedback loop coupled to the tunable laser to receive the optical signal, the optoelectronic feedback loop including at least one delay component over which the optical signal is stored, wherein an output of the optoelectronic feedback loop is connected to the tunable laser for feeding the optical signal back into the laser, wherein the tunable laser includes a PIN structure having an active layer between p-type and n-type semiconductor regions;

a feedback mirror including one of a distributed Bragg reflector or a Fabry-Perot resonator, the feedback mirror being configured to lase at a selected optical wavelength;

a phase modulator for controlling a phase of the optical signal; and a multi-quantum well structure formed along the active layer of the PIN structure, wherein the optoelectronic feedback loop provides for self-injection locking and self-phase locked looping of the optical signal to stabilize the inter-modal separation frequency of the optical signal.

Example 27. The optoelectronic device of Example 26, wherein optoelectronic feedback loop controls the phase modulator to have a phase condition that meets Barkhausen oscillation conditions to stabilize the inter-modal separation frequency of the optical signal.

The invention claimed is:

1. A device comprising:
a tunable multi-mode laser configured to generate a multi-mode optical signal at a tuned wavelength; and
a feedback loop coupled to the tunable multi-mode laser to receive the multi-mode optical signal and including at least one delay line, wherein an output of the delay line is fed back to the tunable multi-mode laser in order to provide at least one of self-injection locking and self-phase locked looping for the tunable multi-mode laser,
wherein the tunable multi-mode laser includes:
at a first end of the tunable multi-mode laser, a semiconductor optical gain region;
at a second end of the tunable multi-mode laser, a feedback region including a feedback mirror configured to sustain an optical signal at a plurality of wavelengths separated by an inter-modal separation frequency; and
between the semiconductor optical gain region and feedback region, a phase modulation region configured to control a phase of the multi-mode optical signal transmitted through the phase modulation region,
wherein the output of the delay line fed back into the tunable multi-mode laser is configured to bias each of the semiconductor optical gain region and phase modulation region in order to reduce phase drift of the multi-mode optical signal.

2. The device of claim 1, wherein the tunable multi-mode laser is formed from a PIN structure having a p-type semiconductor region, an n-type semiconductor region, and an active layer between the p-type and n-type semiconductor regions, and wherein the semiconductor optical gain region includes a multi-quantum well structure formed along the active layer.

3. The device of claim 2, wherein the PIN structure is formed from indium phosphide, and wherein the multi-quantum well structure is formed from one of an indium gallium arsenide phosphide alloy or an indium aluminum arsenide alloy.

4. The device of claim 1, wherein the inter-modal separation frequency of the plurality of wavelengths of the multi-mode optical signal is about 40 GHz.

5. The device of claim 1, wherein the feedback mirror of the feedback region is one of a distributed Bragg reflector or a Fabry-Perot resonator.

6. The device of claim 1, wherein the phase modulation region includes a phase modulator having a sensitivity of about 15 degrees/(V*mm) under an applied voltage of between 6-7 volts.

7. The device of claim 1, wherein the feedback loop is a self-injection locking component including the delay line and further including:
 a semiconductor optical amplifier configured to amplify an output of the delay line; and
 an optical combiner configured to receive each of the multi-mode optical signal generated by the tunable multi-mode laser and the output of the delay line, and to feed the output of the delay line back into the tunable multi-mode laser.

8. The device of claim 7, wherein the tunable multi-mode laser includes a first current source for controlling gain at the semiconductor optical gain region, and a second current source for controlling phase modulation at the phase modulation region, wherein each of the first current source and second current source are electrically isolated from each other, and wherein the optical combiner is configured to feed the output of the delay line into each of the first current source and the second current source.

9. The device of claim 7, wherein the semiconductor optical amplifier has gain of about 2 dB, wherein the feedback loop is configured to reduce a frequency drift of the multi-mode optical signal over a duration of 1 hour from more than 11 GHz to less than 8 GHz.

10. The device of claim 7, wherein the semiconductor optical amplifier has gain of about 5 dB, wherein the feedback loop is configured to reduce a frequency drift of the multi-mode optical signal over a duration of 1 hour from more than 11 GHz to less than 6 GHz.

11. The device of claim 1, wherein the feedback loop is an optoelectronic self-phase locked looping component including the delay line and further including:
 a first optical-to-electrical converter configured to receive an undelayed version of the multi-mode optical signal from the tunable multi-mode laser and to convert the received undelayed version of the multi-mode optical signal from an optical domain to an electrical domain;
 a first electrical line configured to receive the converted undelayed version of the multi-mode optical signal from the first optical-to-electrical converter;
 a second optical-to-electrical converter configured to receive a delayed version of the multi-mode optical signal from the delay line and to convert the received delayed version of the multi-mode optical signal from the optical domain to the electrical domain;
 a second electrical line configured to receive the converted delayed version of the multi-mode optical signal from the second optical-to-electrical converter; and
 a phase mixer coupled to each of the first electrical line and the second electrical line and configured to combine the converted undelayed version of the multi-mode optical signal and the converted delayed version of the multi-mode optical signal into a combined signal, wherein the device is further configured such that the combined signal is fed back into the tunable multi-mode laser.

12. The device of claim 11, further comprising an amplifier coupled to an output of the phase mixer and configured to amplify the combined signal, wherein the device is configured such that the amplified combined signal is fed back into the tunable multi-mode laser.

13. The device of claim 11, wherein each of the first electrical line and the second electrical line includes a narrowband filter for filtering the converted undelayed version of the multi-mode optical signal and the converted delayed version of the multi-mode optical signal, respectively, and wherein each narrow band filter is centered at a same frequency selected based on the intermodal separation frequency.

14. The device of claim 1, wherein the feedback loop is an optoelectronic self-injection locking self-phase locked looping feedback loop including:
 a self-injection locking component including:
  a semiconductor optical amplifier configured to amplify an output of the delay line; and
  an optical combiner configured to receive each of the multi-mode optical signal generated by the tunable multi-mode laser and the output of the delay line, and to feed the output of the delay line back into the tunable multi-mode laser; and
 a self-phase locked looping component including:
 a first optical-to-electrical converter configured to receive an undelayed version of the multi-mode optical signal from the tunable multi-mode laser and to convert the received undelayed version of the multi-mode optical signal from an optical domain to an electrical domain;
 a first electrical line configured to receive the converted undelayed version of the multi-mode optical signal from the first optical-to-electrical converter;
 a second optical-to-electrical converter configured to receive a delayed version of the multi-mode optical signal from the delay line and to convert the received delayed version of the multi-mode optical signal from the optical domain to the electrical domain;
 a second electrical line configured to receive the converted delayed version of the multi-mode optical signal from the second optical-to-electrical converter; and
 a phase mixer coupled to each of the first electrical line and the second electrical line and configured to combine the converted undelayed version of the multi-mode optical signal and the converted delayed version of the multi-mode optical signal into a combined signal, wherein the device is further configured such that the combined signal is fed back into the tunable multi-mode laser.

15. The device of claim 1, further comprising an optical coupler coupled to an output of the tunable multi-mode laser, and configured to split the multi-mode optical signal generated by the tunable multi-mode laser, wherein only a portion of the multi-mode optical signal generated by the tunable multi-mode laser is provided to the delay line.

16. The device of claim 1, wherein the tunable multi-mode laser and the delay line are monolithically integrated.

17. The device of claim 16, wherein the delay line includes a delay element selected from one of: a toroidal micro-resonator; or a ring micro-resonator.

18. The device of claim 17, wherein the delay element is a toroidal micro-resonator having a radius of about 60 microns.

19. The device of claim 17, wherein the delay element is a ring-shaped micro-resonator having a diameter of about 10 microns.

20. The device of claim 17, wherein the delay element has a quality factor in the order of $10^{11}$ for a laser operating at a wavelength of about 1550 nm.

21. The device of claim 17, wherein the delay element creates a delay of about 250 μs.

22. The device of claim 16, wherein the delay line includes one or more photonic bandgap fibers.

23. The device of claim 1, wherein the feedback loop includes a plurality of delay lines, each delay line providing at least one of injection locking feedback or phase locked looping feedback to the tunable multi-mode laser.

24. The device of claim 23, wherein at least one of the plurality of delay lines includes a phase locked looping feedback element having an external reference signal to lock oscillations of the multi-mode optical signal.

25. The device of claim 1, wherein each of the semiconductor optical gain region, the feedback region and the phase modulation region of the tunable multi-mode laser is monolithically integrated.

26. An optoelectronic device comprising:
 a tunable laser configured to generate an optical signal at a tuned wavelength with a plurality of modes having an inter-modal separation frequency with a range of radio frequency (RF) frequencies; and
 an optoelectronic feedback loop coupled to the tunable laser to receive the optical signal, the optoelectronic feedback loop including at least one delay component over which the optical signal is stored, wherein an output of the optoelectronic feedback loop is connected to the tunable laser for feeding the optical signal back into the tunable laser,
 wherein the tunable laser includes:
 a PIN structure having an active layer between p-type and n-type semiconductor regions;
 a feedback mirror including one of a distributed Bragg reflector or a Fabry-Perot resonator, the feedback mirror being configured to lase at a selected optical wavelength;
 a phase modulator for controlling a phase of the optical signal; and
 a multi-quantum well structure formed along the active layer of the PIN structure,
 wherein the optoelectronic feedback loop provides for self-injection locking and self-phase locked looping of the optical signal to stabilize the inter-modal separation frequency of the optical signal.

27. The optoelectronic device of claim 26, wherein the optoelectronic feedback loop controls the phase modulator to have a phase condition that meets Barkhausen oscillation conditions to stabilize the inter-modal separation frequency of the optical signal.

* * * * *